(12) United States Patent
Chang et al.

(10) Patent No.: US 9,686,866 B2
(45) Date of Patent: Jun. 20, 2017

(54) PACKAGE STRUCTURE AND MANUFACTURING METHOD THEREOF

(71) Applicant: Unimicron Technology Corp., Taoyuan (TW)

(72) Inventors: Hung-Lin Chang, Taoyuan (TW); Ta-Han Lin, Tainan (TW)

(73) Assignee: Unimicron Technology Corp., Taoyuan (TW)

( * ) Notice: Subject to any disclaimer, the term of this patent is extended or adjusted under 35 U.S.C. 154(b) by 145 days.

(21) Appl. No.: 14/833,129

(22) Filed: Aug. 23, 2015

(65) Prior Publication Data

US 2017/0055349 A1    Feb. 23, 2017

(51) Int. Cl.
| | |
|---|---|
| *H05K 1/18* | (2006.01) |
| *H05K 3/46* | (2006.01) |
| *H05K 1/11* | (2006.01) |
| *H05K 1/02* | (2006.01) |
| *H05K 1/03* | (2006.01) |

(52) U.S. Cl.
CPC .......... *H05K 1/186* (2013.01); *H05K 1/0298* (2013.01); *H05K 1/0326* (2013.01); *H05K 1/0333* (2013.01); *H05K 1/0346* (2013.01); *H05K 1/111* (2013.01); *H05K 1/115* (2013.01); *H05K 3/4644* (2013.01); *H05K 3/4697* (2013.01); *H05K 2201/0129* (2013.01); *H05K 2201/0145* (2013.01); *H05K 2201/09545* (2013.01)

(58) Field of Classification Search
CPC ...... H05K 1/186; H05K 3/4644; H05K 1/111; H05K 1/115; H05K 3/4697; H05K 1/0346; H05K 1/0298; H05K 1/0326; H05K 1/0333; H05K 2201/0129; H05K 2201/09545; H05K 2201/0145

See application file for complete search history.

(56) References Cited

U.S. PATENT DOCUMENTS

| | | | | |
|---|---|---|---|---|
| 5,610,799 | A * | 3/1997 | Kato | ....................... H01L 23/24 |
| | | | | 174/252 |
| 5,639,990 | A * | 6/1997 | Nishihara | ............. H01L 23/043 |
| | | | | 174/260 |
| 6,667,480 | B2 * | 12/2003 | Kajiwara | .......... H01L 27/14623 |
| | | | | 250/370.01 |
| 7,122,901 | B2 * | 10/2006 | Sunohara | ............ H01L 23/5389 |
| | | | | 257/750 |
| 7,408,253 | B2 | 8/2008 | Lin | |

(Continued)

*Primary Examiner* — Nathan Milakovich
(74) *Attorney, Agent, or Firm* — Jianq Chyun IP Office

(57) ABSTRACT

A package structure includes a circuit substrate, at least one electronic component, and a connecting slot. The circuit substrate includes at least one core layer, a build-up structure including at least three patterned circuit layers, at least two dielectric layers and conductive through holes, and circuit pads. The electronic component is embedded in at least one of the dielectric layers and located in a disposition area. The electronic component is electrically connected to one of the patterned circuit layers through a portion of the conductive through holes. The connecting slot has a bottom portion, a plurality of sidewall portions connecting the bottom portion, and a plurality of connecting pads located on the sidewall portions. The circuit substrate is assembled to the bottom portion, and the circuit pads are electrically connected to the connecting pads through a bent area of the core layer that is bent relative to the disposition area.

11 Claims, 12 Drawing Sheets

(56) References Cited

U.S. PATENT DOCUMENTS

| | | | |
|---|---|---|---|
| 7,902,676 B2 | 3/2011 | Chia | |
| 8,115,112 B2* | 2/2012 | Corisis | H01L 23/13 174/255 |
| 9,236,330 B2* | 1/2016 | Kadoguchi | H01L 23/49562 |
| 2007/0241447 A1* | 10/2007 | Cheung | H01L 23/10 257/704 |
| 2008/0066953 A1* | 3/2008 | Kanai | H05K 1/0218 174/260 |
| 2013/0083494 A1* | 4/2013 | Syal | H05K 1/141 361/735 |
| 2016/0050768 A1* | 2/2016 | Chen | H05K 3/40 361/728 |

* cited by examiner

PACKAGE STRUCTURE AND MANUFACTURING METHOD THEREOF

TECHNICAL FIELD

The disclosure relates to a package structure and a manufacturing method thereof. More particularly, the disclosure relates to a package structure having a small volume and a manufacturing method of the package structure.

DESCRIPTION OF RELATED ART

In general, performing a packaging process aims at protecting an exposed electronic component, lowering the density of contacts on the electronic component, and effectively dissipating heat generated by the electronic component. The common way to package the electronic component is to arrange the electronic component on a die pad of a leadframe via an adhesion layer, and the contacts on the electronic component are electrically connected to inner leads of the leadframe through wire-bonding; the electronic component, the die pad, and the inner leads are then packaged by a molding compound, so as to expose outer leads of the leadframe. The packaged component is then inserted into a female socket through the outer leads, so as to complete the manufacture of the package structure.

In the conventional package structure, the electronic component is packaged by a molding compound, and therefore the thickness and the volume of the packaged component are both increased. Besides, in order for the female socket to be electrically connected to the packaged component, the female socket requires certain space to accommodate the packaged component. That is, the volume and the thickness of the conventional package structure cannot be reduced effectively, and therefore consumers' requirement for compactness of electronic products cannot be satisfied.

SUMMARY

The disclosure is directed to a package structure having a relatively small volume, so as to comply with the requirement for compactness.

The disclosure is also directed to a manufacturing method for manufacturing the aforesaid package structure.

In an embodiment of the disclosure, a package structure includes a circuit substrate, at least one electronic component, and a connecting slot. The circuit substrate includes at least one core layer, a build-up structure including at least three patterned circuit layers, at least two dielectric layers and a plurality of conducive through holes, and a plurality of circuit pads. The core layer has a disposition area, a bent area surrounding the disposition area, and an upper surface and a lower surface opposite to each other. The build-up structure is arranged on the core layer and located in the disposition area. The patterned circuit layers and the dielectric layers are alternately stacked. The conductive through holes are electrically connected to every two adjacent patterned circuit layers. The circuit pads are arranged on the lower surface of the core layer and located in the bent area. The electronic component is embedded in at least one of the dielectric layers and located in the disposition area, and the electronic component is electrically connected to one of the patterned circuit layers through a portion of the conductive through holes. The connecting slot has a bottom portion, a plurality of sidewall portions connecting the bottom portion, and a plurality of connecting pads located on the sidewall portions. The circuit substrate is assembled to the bottom portion, and the circuit pads are electrically connected to the connecting pads through the bent area of the core layer bent relative to the disposition area.

According to an embodiment of the disclosure, a profile of the disposition area of the core layer is shaped as an oblong, and a profile of the bent area of the core layer is shaped as a plurality of rectangles separated from each other.

According to an embodiment of the disclosure, the circuit substrate further includes two solder mask layers respectively arranged on the upper surface and the lower surface of the core layer and located in the disposition area. The solder mask layers cover two of the patterned circuit layers farthest from the upper surface and the lower surface of the core layer.

According to an embodiment of the disclosure, the circuit substrate further includes a plurality of surface treatment patterns respectively arranged on the circuit pads, and the surface treatment patterns are in direct contact with the connecting pads.

According to an embodiment of the disclosure, the circuit substrate further includes a plurality of auxiliary patterns arranged on the upper surface of the core layer and located in the bent area, and the auxiliary patterns respectively correspond to the circuit pads.

According to an embodiment of the disclosure, the number of the at least one core layer is two, and the core layers, the patterned circuit layers, and the dielectric layers are vertically stacked.

According to an embodiment of the disclosure, an included angle is between each of the sidewall portions of the connecting slot and the bottom portion, the included angle is greater than 90 degrees and less than 180 degrees, and the connecting pads are located at different horizontal levels.

In an embodiment of the disclosure, a manufacturing method of a package structure includes following steps. A circuit substrate having at least one electronic component embedded in the circuit substrate is provided. The circuit substrate includes at least one core layer, a build-up structure including at least three patterned circuit layers, at least two dielectric layers and a plurality of conductive through holes, and a plurality of circuit pads. The core layer has a disposition area, a bent area surrounding the disposition area, and an upper surface and a lower surface opposite to each other. The build-up structure is arranged on the core layer, located in the disposition area. The patterned circuit layers and the dielectric layers are alternately stacked. The conductive through holes are electrically connected to every two adjacent patterned circuit layers, and the circuit pads are arranged on the lower surface of the core layer and located in the bent area. The electronic component is embedded in at least one of the dielectric layers and located in the disposition area. The electronic component is electrically connected to one of the patterned circuit layers by a portion of the conductive through holes. A connecting slot is provided. Here, the connecting slot has a bottom portion, a plurality of sidewall portions connecting the bottom portion, and a plurality of connecting pads located on the sidewall portions. The circuit substrate having the electronic component embedded in the circuit substrate is assembled to the connecting slot. Here, the circuit substrate is located on the bottom portion of the connecting slot, and the circuit pads are electrically connected to the connecting pads through the bent area of the core layer bent relative to the disposition area.

According to an embodiment of the disclosure, the at least three patterned circuit layers include a plurality of inner patterned circuit layers and two outer patterned circuit layers. The at least two dielectric layers include a plurality of inner dielectric layers and two outer dielectric layers. The conductive through holes include a plurality of inner conductive through holes and a plurality of outer conductive through holes. The step of embedding the electronic component in the circuit substrate includes: forming at least one trench in the inner patterned circuit layers and the inner dielectric layers. Here, the trench exposes one of the inner patterned circuit layers, and the inner patterned circuit layers are electrically connected through the inner conductive through holes. The electronic component is arranged in the trench, and the electronic component is located on the one of the inner patterned circuit layers exposed by the trench. Each of the outer dielectric layers and a circuit layer on the each of the outer dielectric layers are respectively laminated onto the upper surface and the lower surface of the core layer. Here, the trench is filled with at least one of the outer dielectric layers. A patterning process and a through-hole forming process are performed, so as to pattern the circuit layers and transform the circuit layers into the outer patterned circuit layers and to form the outer conductive through holes. The outer patterned circuit layers are respectively electrically connected to the electronic component and the inner patterned circuit layers through the outer conductive through holes.

According to an embodiment of the disclosure, before the circuit substrate having the electronic component embedded in the circuit substrate is assembled to the connecting slot, the manufacturing method further includes: forming two solder mask layers on the upper surface and the lower surface of the core layer. Here, the solder mask layers are located in the disposition area and respectively cover the outer patterned circuit layers.

According to an embodiment of the disclosure, before the circuit substrate having the electronic component embedded in the circuit substrate is assembled to the connecting slot, the manufacturing method further includes: forming a plurality of surface treatment patterns on the circuit pads.

In view of the above, the electronic component of the package structure provided herein is embedded in the circuit substrate, and the circuit substrate is assembled to the bottom portion of the connecting slot. Here, the circuit substrate is located on the bottom portion of the connecting slot, and the circuit pads on the circuit substrate are electrically connected to the connecting pads of the connecting slot through the bent area of the core layer bent relative to the disposition area. Therefore, compared to the conventional package structure which is formed by assembling the component packaged by the molding compound to the female socket, the package structure provided herein has a relatively small package volume.

Several exemplary embodiments accompanied with figures are describe in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the inventive principles of the disclosure.

DETAILED DESCRIPTION OF DISCLOSED EMBODIMENTS

Figure 1A:
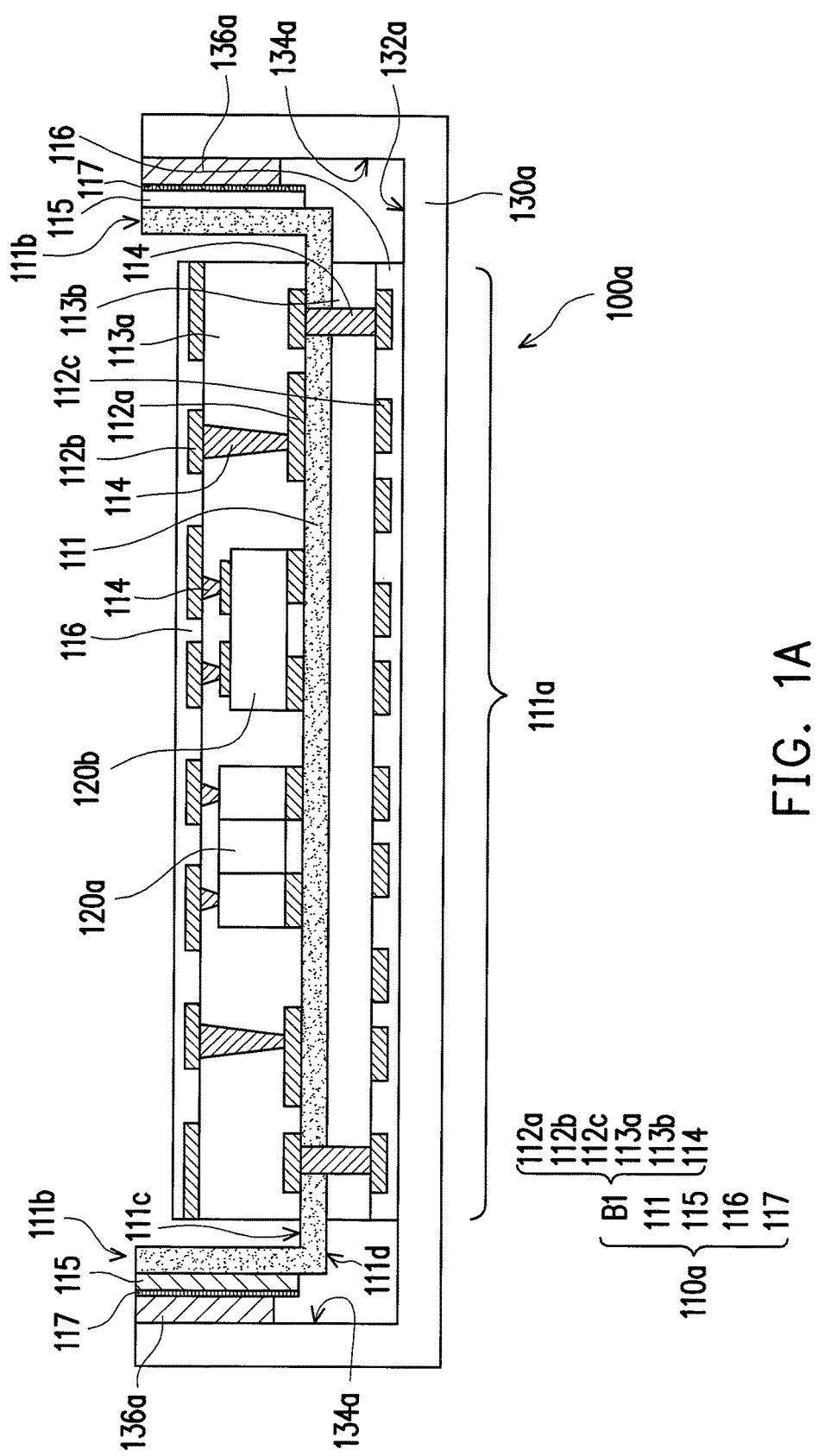
FIG. 1A is a schematic cross-sectional view illustrating a package structure according to an embodiment of the disclosure.
Figure 1B:
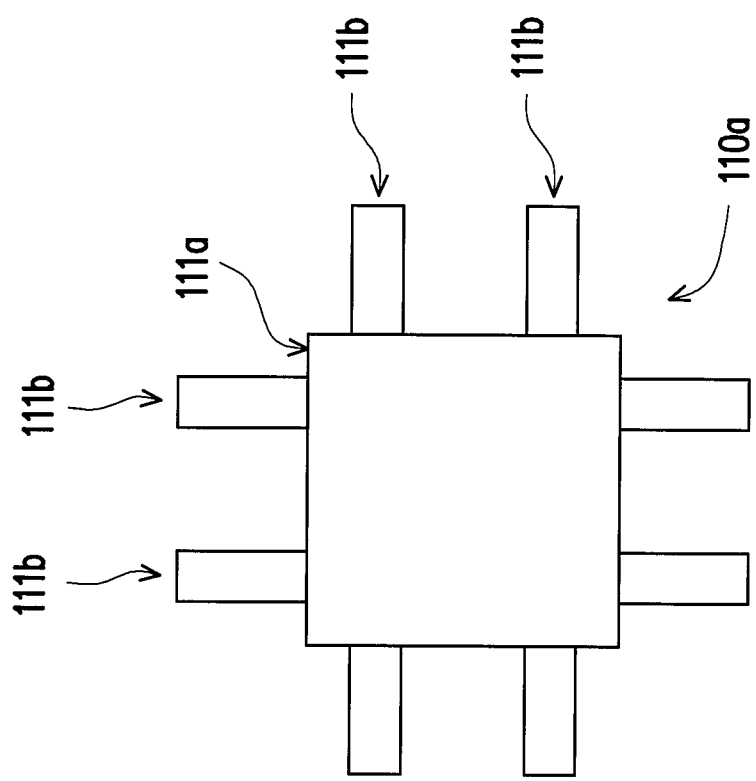
FIG. 1B a schematic top view illustrating the circuit substrate that is depicted in FIG. 1A and is not bent.

FIG. 1A is a schematic cross-sectional view illustrating a package structure according to an embodiment of the disclosure. FIG. 1B a schematic top view illustrating the circuit substrate that is depicted in FIG. 1A and is not bent. As shown in FIG. 1A, in the present embodiment, the package structure 100a includes a circuit substrate 110a, at least one electronic component, and a connecting slot 130a. Here, two electronic components 120a and 120b are schematically depicted in FIG. 1A. The circuit substrate 110a includes at least one core layer 111, a build-up structure B1 including at least three patterned circuit layers, at least two dielectric layers and a plurality of conductive through holes 114, and a plurality of circuit pads 115. In FIG. 1A, one core layer 111, three patterned circuit layers 112a, 112b, and 112c, and two dielectric layers 113a and 113b are schematically depicted.

Specifically, the core layer 111 has a disposition area 111a, a bent area 111b surrounding the disposition area 111a, and an upper surface 111c and a lower surface 111d opposite to each other. The build-up structure B1 is arranged on the core layer 111 and located in the disposition area 111a. Here, the dielectric layers 113a and 113b are located between the patterned circuit layers 112a, 112b, and 112c, and the patterned circuit layers 112a, 112b, and 112c and the dielectric layers 113a and 113b are alternately stacked. The conductive through holes 114 are electrically connected to every two adjacent patterned circuit layers of the patterned circuit layers 112a, 112b, and 112c. The circuit pads 115 are arranged on the lower surface 111d of the core layer 111 and located in the bent area 111b. The electronic components 120a and 120b are embedded in the dielectric layer 113a and located in the disposition area 111a, and the electronic components 120a and 120b are electrically connected to the patterned circuit layer 112b through a portion of the conductive through holes 114. The connecting slot 130a has a bottom portion 132a, a plurality of sidewall portions 134a connecting the bottom portion 132a, and a plurality of connecting pads 136a located on the sidewall portions 134a. The circuit substrate 110a is assembled to the bottom portion 132a, and the circuit pads 115 are electrically connected to the connecting pads 136a through the bent area 111b of the core layer 111 bent relative to the disposition area 111a.

Particularly, the circuit substrate 110a is a three-layer circuit substrate, and a material of the core layer 111 includes but is not limited to polyidime with flexibility or any other appropriate flexible material, e.g., polyethylene terephthalate (PET), polyethersulfone (PES), or polyethylene naphthalate (PEN). With reference to FIG. 1B, a profile of the disposition area 111a of the core layer 111 is shaped as an oblong, for instance, and a profile of the bent area 111b of the core layer 111 is shaped as a plurality of rectangles separated from each other, for instance. The electronic components 120a and 120b are active components (e.g., transistors) or passive components (e.g., resistors, capacitors, inductors, or filters), which should however not be construed as limitations to the disclosure. Moreover, the circuit substrate 110a provided in the present embodiment may further include two solder mask layers 116 respectively arranged on the upper surface 111c and the lower surface 111d of the core layer 111 and located in the disposition area 111a. The solder mask layers 116 cover the patterned circuit layers 112b and 112c farthest from the upper surface 111c and the lower surface 111d of the core layer 111 for protecting the patterned circuit layers 112b and 112c. In addition, the circuit substrate 110a described herein may further include a plurality of surface treatment patterns 117 respectively arranged on the circuit pads 115, and the surface treatment patterns 117 are in direct contact with the connecting pads 136a.

Since the electronic components 120a and 120b provided in the present embodiment are embedded in the circuit substrate 110a, it is not necessary to package the components by using the conventional molding compound, so as to effectively reduce the overall volume and the overall thickness of the package after the electronic components 120a and 120b are assembled to the circuit substrate 110a. Moreover, no molding compound is required; hence, the manufacturing process of the entire package structure can be effectively simplified, and the production costs can be effectively lowered down. In the present embodiment, the circuit substrate 110a is assembled to the bottom portion 132a of the connecting slot 130a, and the circuit pads 115 on the circuit substrate 110a are electrically connected to the connecting pads 136a of the connecting slot 130a through the bent area 111b of the core layer 111 bent relative to the disposition area 111a. Therefore, compared to the conventional package structure which is formed by assembling the component packaged by the molding compound to the female socket, the package structure provided herein has a relatively small package volume.

It should be mentioned that reference numbers and some descriptions provided in the previous exemplary embodiment are also applied in the following exemplary embodiment. The same reference numbers represent the same or similar components in these exemplary embodiments, and repetitive descriptions are omitted. The omitted descriptions may be found in the previous exemplary embodiments.

Figure 2:
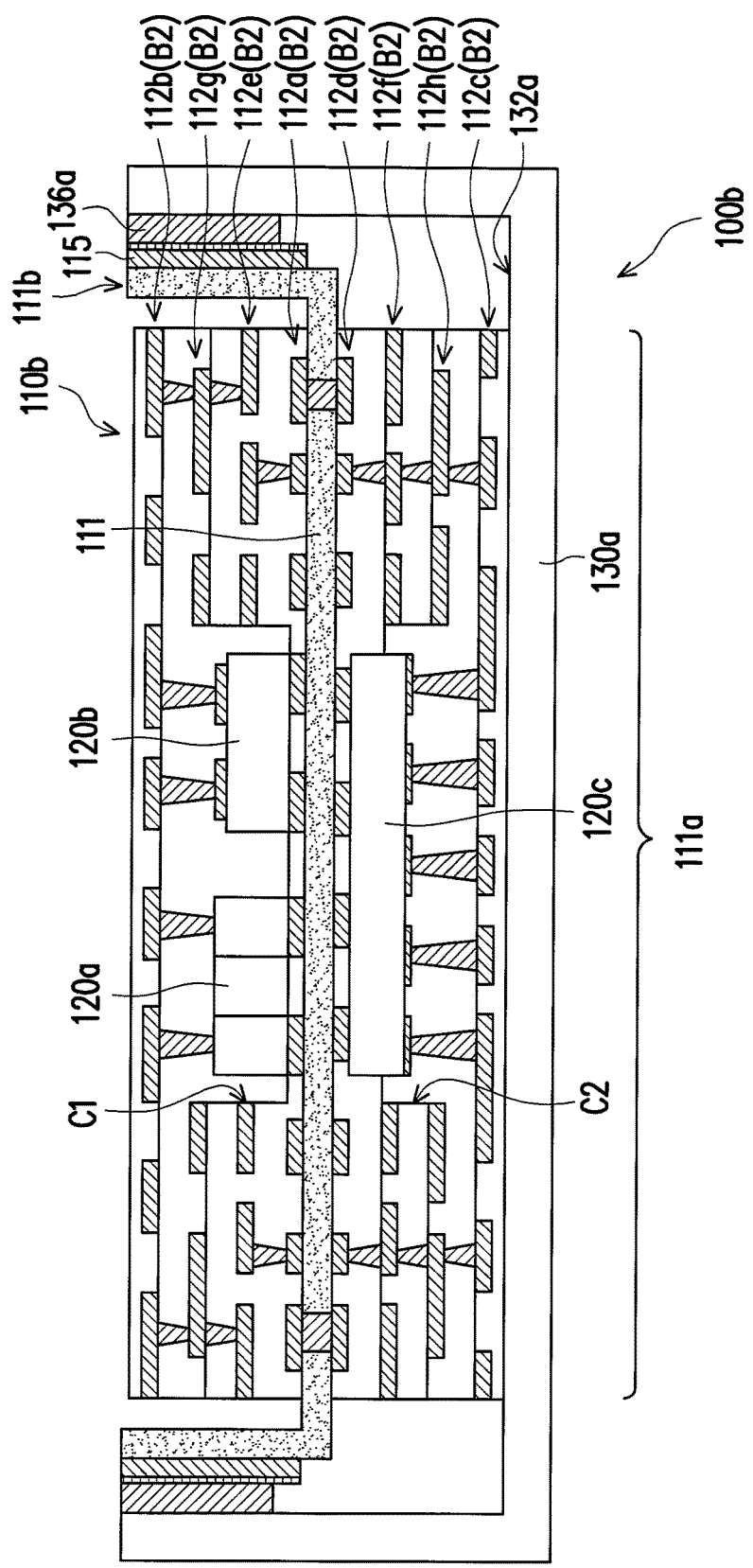
FIG. 2 is a schematic cross-sectional view illustrating a package structure according to another embodiment of the disclosure.

FIG. 2 is a schematic cross-sectional view illustrating a package structure according to another embodiment of the disclosure. With reference to FIG. 1A and FIG. 2, the package structure 100b provided in the present embodiment is similar to the package structure 100a depicted in FIG. 1A, and the differences between these package structures 100a and 100b lie in that the circuit substrate 110b provided herein is an eight-layer circuit substrate, i.e., the build-up structure B2 of the circuit substrate 110b has eight patterned circuit layers 112a, 112b, 112c, 112d, 112e, 112f, 112g, and 112h, and three electronic components 120a, 120b, and 120c are embedded in the circuit substrate 110b. As shown in FIG. 2, the circuit substrate 110b described in the present embodiment has two trenches C1 and C2 respectively exposing the patterned circuit layers 112a and 112d. The electronic components 120a and 120b are located in the trench C1 and are in direct contact with the patterned circuit layer 112a exposed by the trench C1, and the electronic component 120c is located in the trench C2 and is in direct contact with the patterned circuit layer 112d exposed by the trench C2.

The electronic components 120a, 120b, and 120c of the package structure 100b provided herein are embedded in the circuit substrate 110b, and the circuit substrate 110b is assembled to the bottom portion 132a of the connecting slot 130a. Hence, the circuit pads 115 on the circuit substrate 110b are electrically connected to the connecting pads 136a of the connecting slot 130a through the bent area 111b of the core layer 111 bent relative to the disposition area 111a. Therefore, compared to the conventional package structure which is formed by assembling the component packaged by the molding compound to the female socket, the package structure 100b provided herein has a relatively small package volume.

Figure 3:
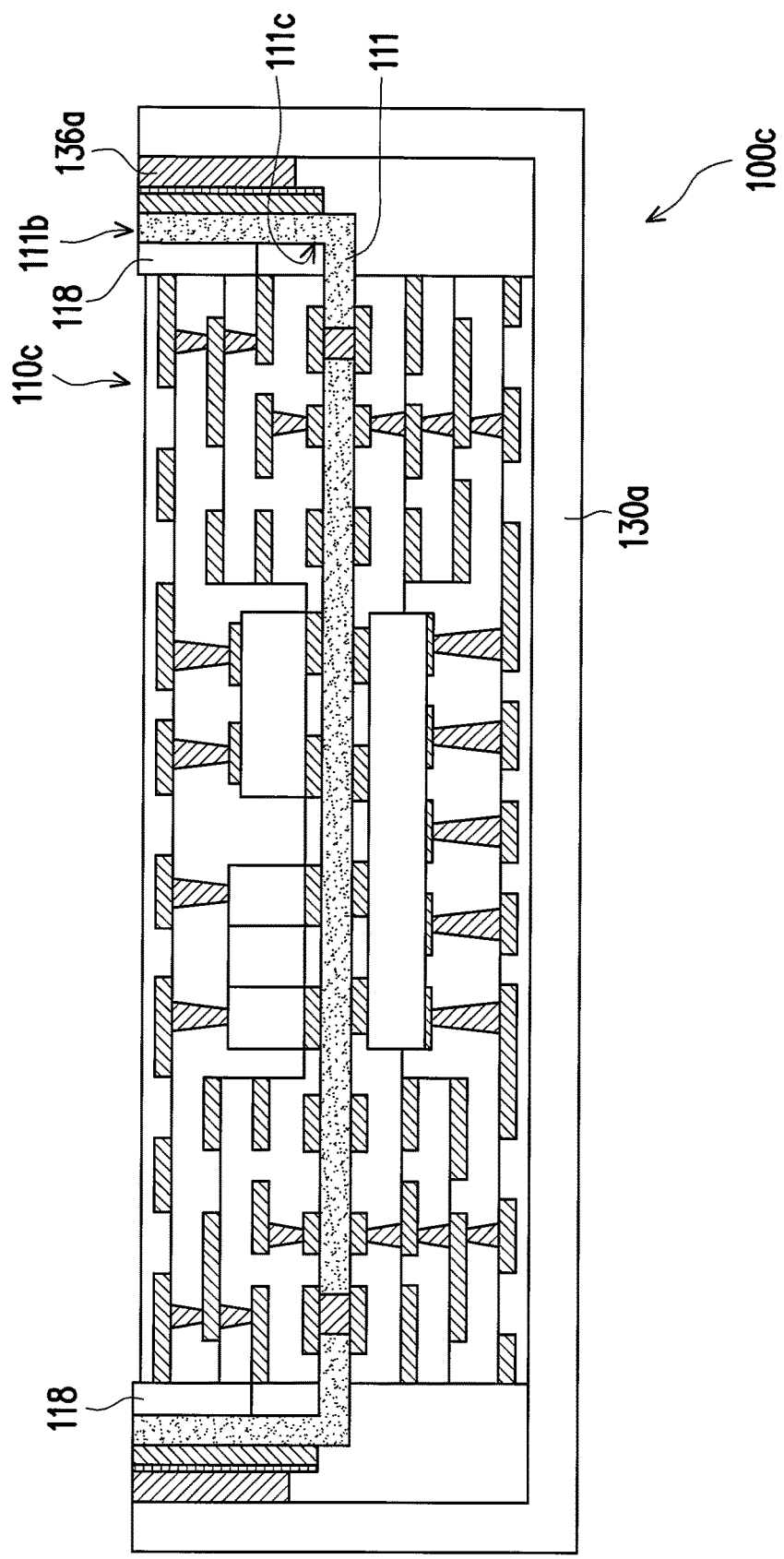
FIG. 3 is a schematic cross-sectional view illustrating a package structure according to another embodiment of the disclosure.

FIG. 3 is a schematic cross-sectional view illustrating a package structure according to another embodiment of the disclosure. With reference to FIG. 2 and FIG. 3, the package structure 100c provided in the present embodiment is similar to the package structure 100b depicted in FIG. 2, while the differences therebetween lie in that the circuit substrate 110c described in the present embodiment further includes a plurality of auxiliary patterns 118 arranged on the upper surface 111c of the core layer 111 and located in the bent area 111b, and the auxiliary patterns 118 respectively correspond to the circuit pads 136a. The auxiliary patterns 118 are arranged to ensure the electrical connection between the circuit pads 115 and the connecting pads 136a due to the gravity resulting from the bent area 111b that has been bent.

Figure 4:
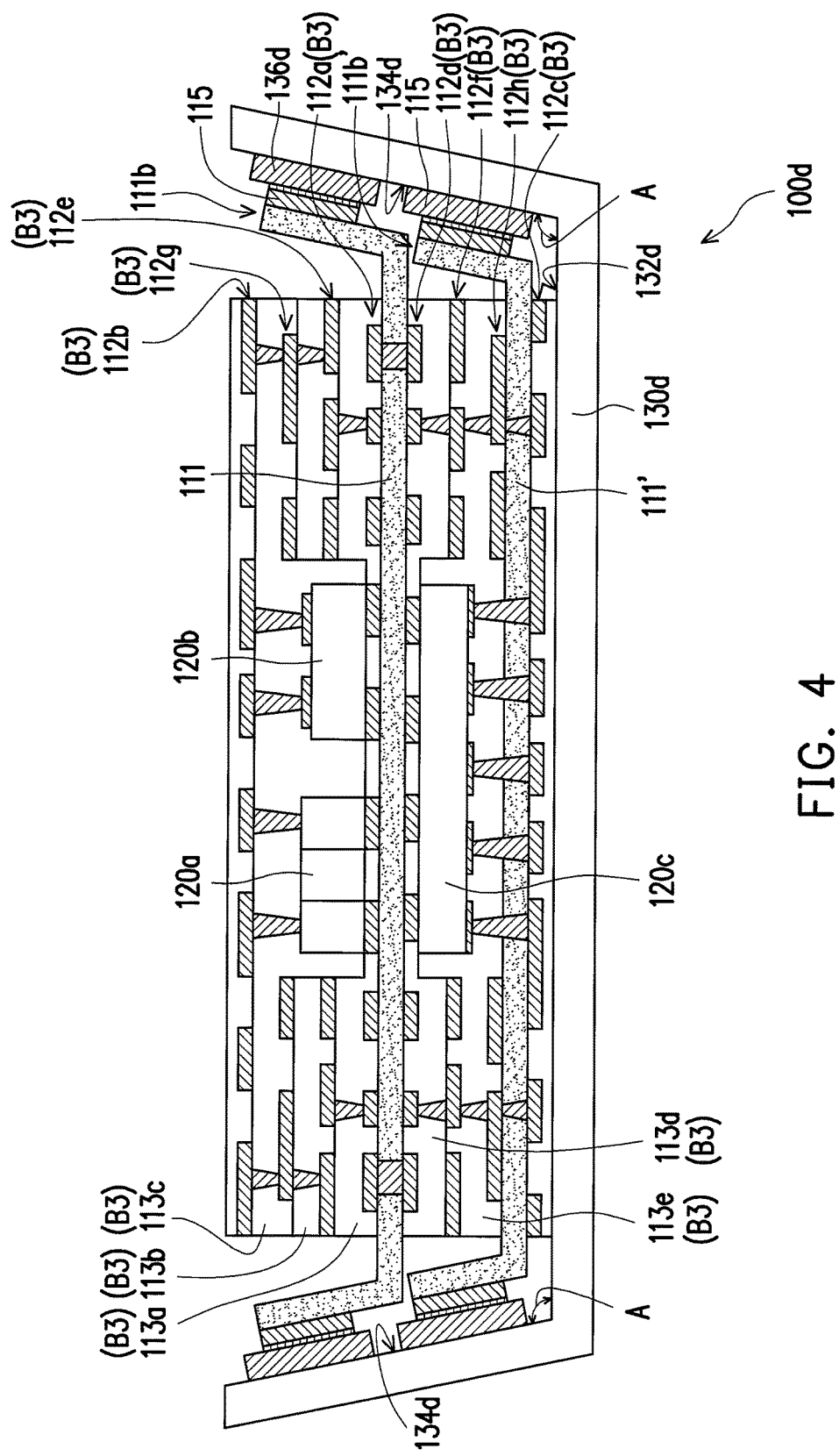
FIG. 4 is a schematic cross-sectional view illustrating a package structure according to another embodiment of the disclosure.

FIG. 4 is a schematic cross-sectional view illustrating a package structure according to another embodiment of the disclosure. With reference to FIG. 2 and FIG. 4, the package structure 100d provided in the present embodiment is similar to the package structure 100b depicted in FIG. 2, and the differences between these package structures 100d and 100b lie in that the circuit substrate 110d provided herein has two core layers 111 and 111', and the core layers 111 and 111' and the patterned circuit layers 112a, 112b, 112c, 112d, 112e, 112f, 112g, and 112h, and the dielectric layers 113a, 113b, 113c, 113d, and 113e of the build-up structure B3 are vertically stacked. As shown in FIG. 4, there is an air gap between the bent areas 111b and 111b' of the core layers 111 and 111', i.e., the core layers 111 and 111' are separated from each other. According to the present embodiment, an included angle A is between each of the sidewall portions 134d of the connecting slot 130d and the bottom portion 132d, the included angle A is greater than 90 degrees and less than 180 degrees, and the connecting pads 136d are located at different horizontal levels. When the circuit substrate 110d is assembled to the bottom portion 132d of the connecting slot 130d, the bent areas 111b and 111b' of the core layers 111 and 111' are bent, such that the circuit pads 115 are respectively electrically connected to the connecting pads 136d at different horizontal levels. Besides, the bent areas 111b and 111b' of the core layers 111 and 111' are parallel to the sidewall portions 134d of the connecting slot 130d and are not perpendicular to the bottom portion 132d of the connecting slot 130d.

The package structures 100a, 100b, 100c, and 100d are described above, while a manufacturing method of these package structures 100a, 100b, 100c, and 100d is not yet introduced in the disclosure. The manufacturing method of the exemplary package structure 100b depicted in FIG. 2 is elaborated hereinafter with reference to FIG. 5A to FIG. 5G.

Figure 5A:
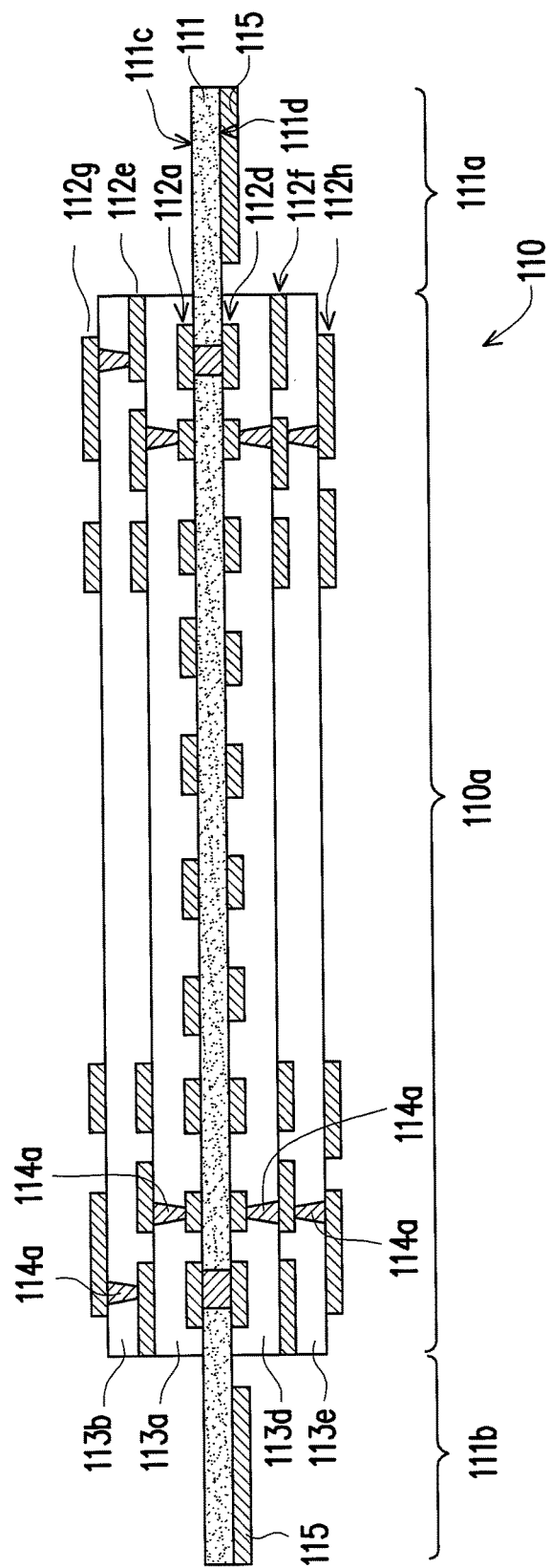
FIG. 5A to FIG. 5G are schematic cross-sectional flowcharts illustrating a manufacturing method of a package structure according to an embodiment of the disclosure.
Figure 5B:
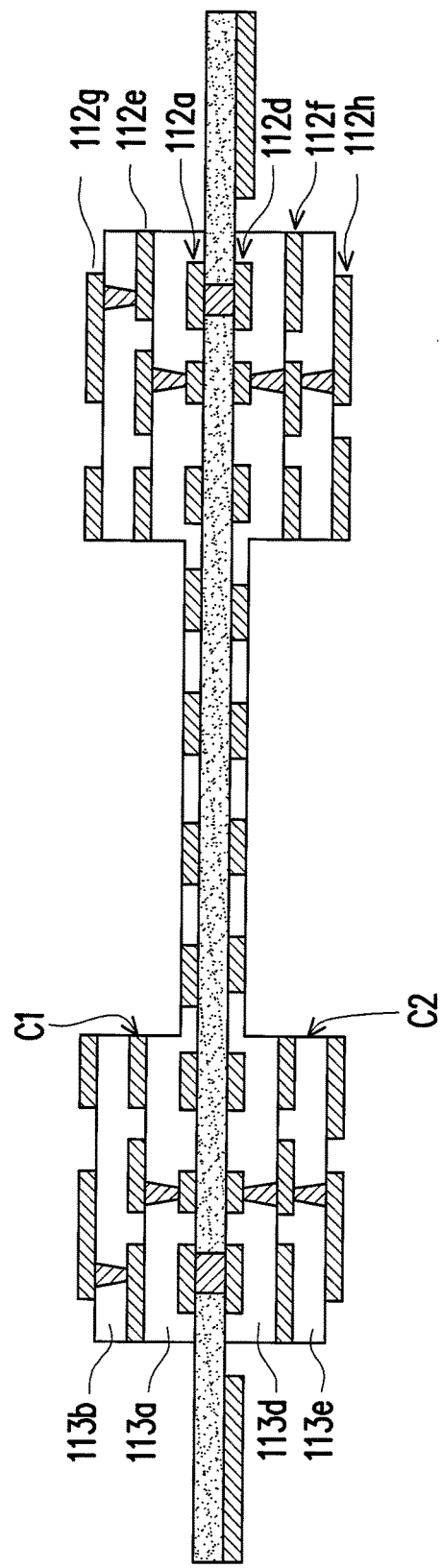
Figure 5C:
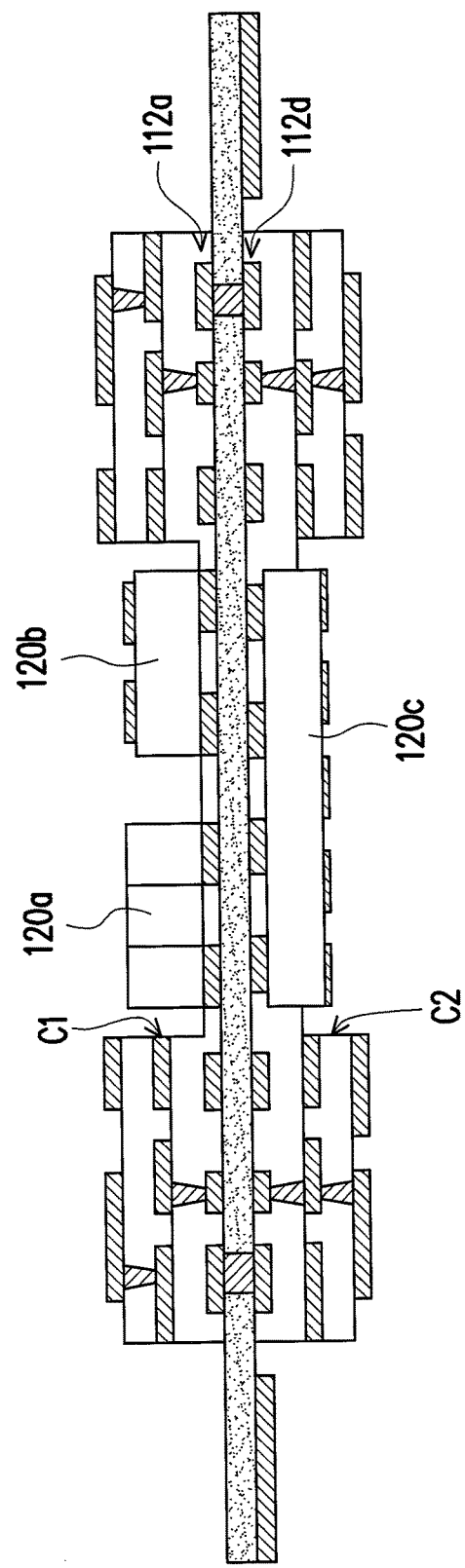
Figure 5D:
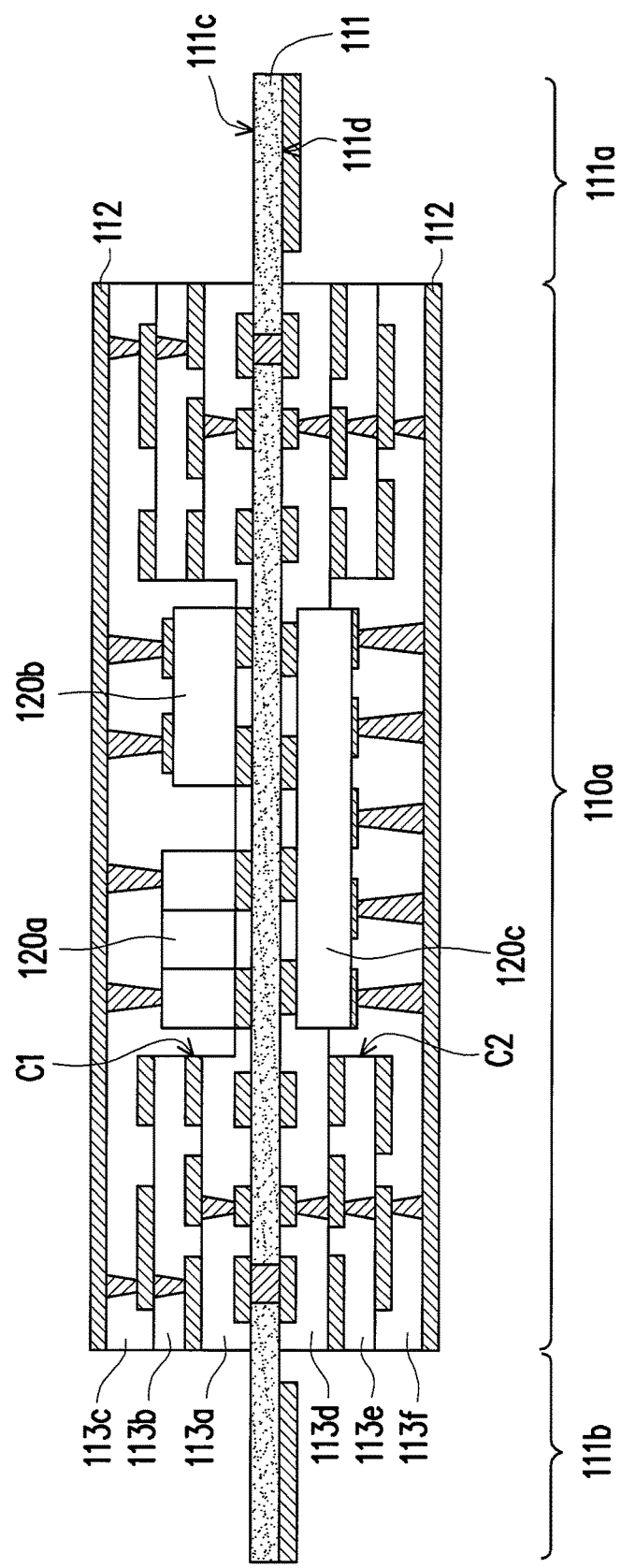
Figure 5E:
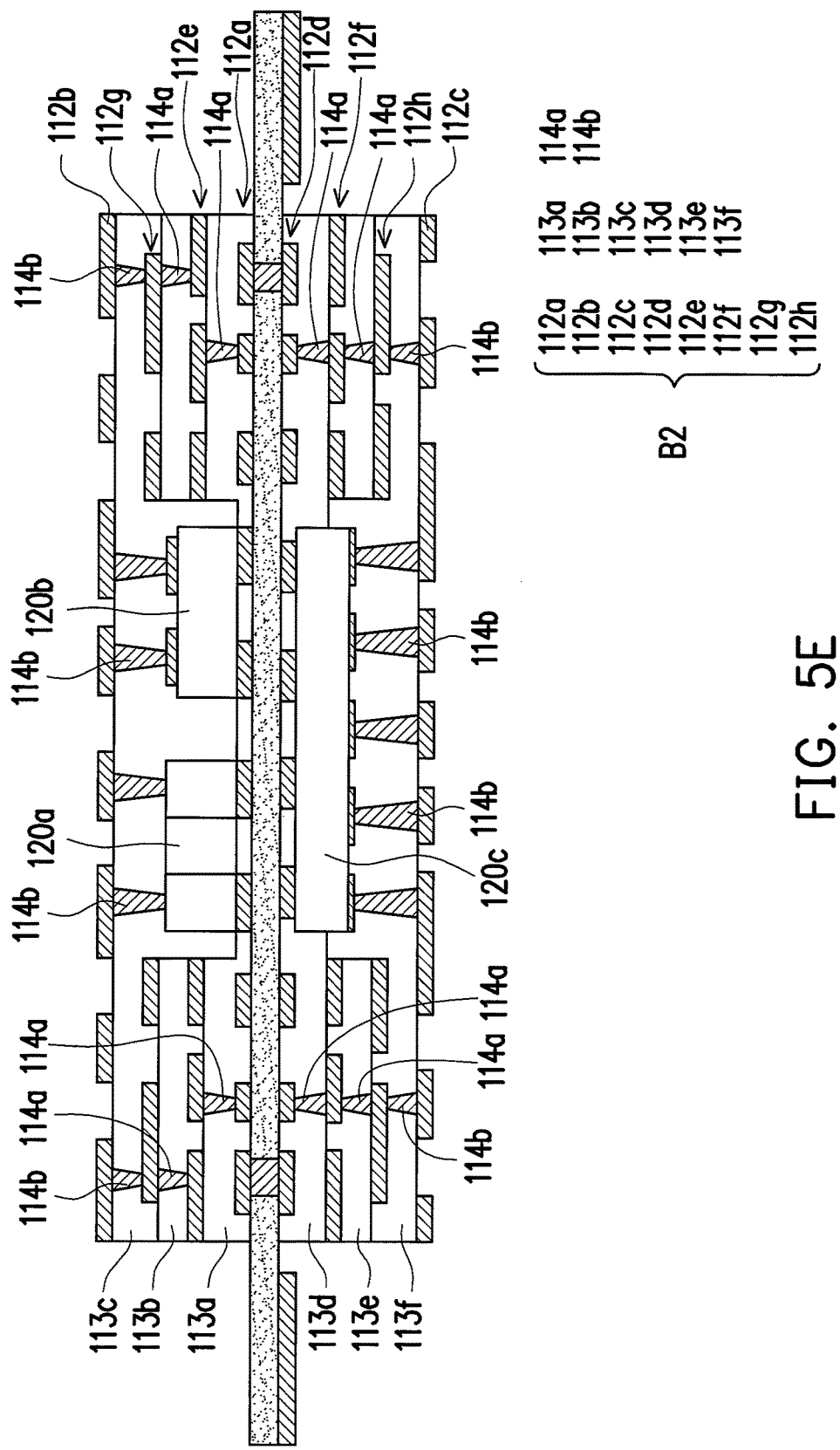
Figure 5F:
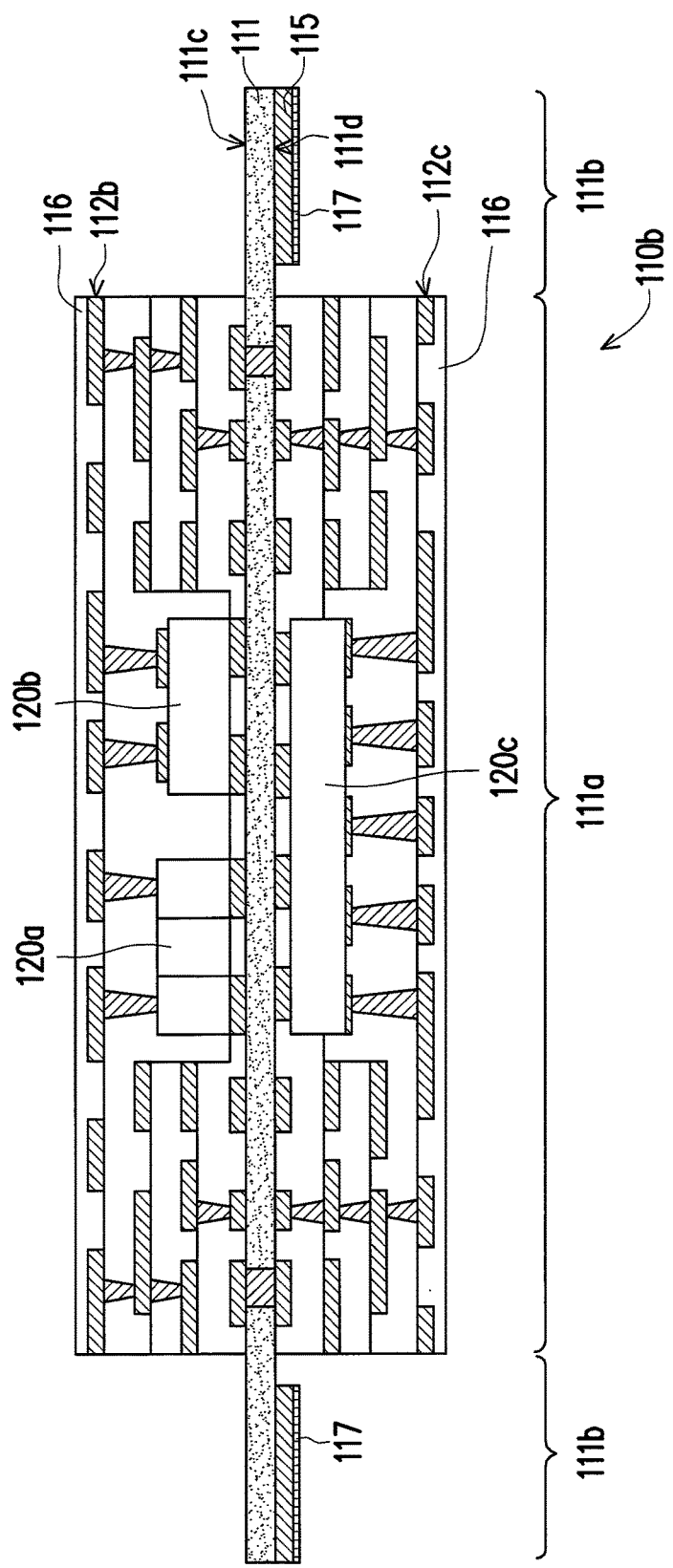

FIG. 5A to FIG. 5G are schematic cross-sectional flowcharts illustrating a manufacturing method of a package structure according to an embodiment of the disclosure. As shown in FIG. 5F, according to the manufacturing method of the package structure provided in the present embodiment, a circuit substrate 110b having embedded electronic components 120a, 120b, and 120c is provided. Specifically, with reference to FIG. 5A, the circuit substrate 110 is provided. Here, the circuit substrate 110 includes the core layer 111, inner patterned circuit layers (i.e., the patterned circuit layers 112a, 112d, 112e, 112f, 112g, and 112h), inner dielectric layers (i.e., the dielectric layers 113a, 113b, 113d, and 113e), inner conductive through holes 114a, and the circuit pads 115. The core layer 111 has the disposition area 111a, the bent area 111b surrounding the disposition area 111a, and the upper surface 111c and the lower surface 111d opposite to each other. The patterned circuit layers 112a, 112d, 112e, 112f, 112g, and 112h and the dielectric layers 113a, 113b, 113d, and 113e are arranged on the core layer 111 and located in the disposition area 111a. Here, the dielectric layers 113a, 113b, 113d, and 113e are located between the patterned circuit layers 112a, 112d, 112e, 112f, 112g, and 112h, and the patterned circuit layers 112a, 112d, 112e, 112f, 112g, and 112h and the dielectric layers 113a, 113b, 113d, and 113e are alternately stacked. The conductive through holes 114a are electrically connected to every two adjacent patterned circuit layers 112a, 112d, 112e, 112f, 112g, and 112h, and the circuit pads 115 are arranged on the lower surface 111d of the core layer 111 and located in the bent area 111b.

With reference to FIG. 5B, the trenches C1 and C2 are formed in the inner patterned circuit layers 112a, 112d, 112e, 112f, 112g, and 112h, and the inner dielectric layers 113a, 113b, 113d, and 113e, and the trenches C1 and C2 respectively exposes the patterned circuit layers 112a and 112d.

With reference to FIG. 5C, the electronic components 120a, 120b, and 120c are arranged in the trenches C1 and C2, and the electronic components 120a, 120b, and 120c are located on the inner patterned circuit layers 112a and 112d exposed by the trenches C1 and C2.

With reference to FIG. 5D, the outer dielectric layers (i.e., the dielectric layers 113c and 113f) and a circuit layer 112 on the outer dielectric layers are laminated onto the upper surface 111c and the lower surface 111d of the core layer 111, and the trenches C1 and C2 are filled with the dielectric layers 113c and 113f. Here, the electronic components 120a and 120b are embedded in the dielectric layer 113c and located in the disposition area 111a, and the electronic component 120c is embedded in the dielectric layer 113f and located in the disposition area 111a.

With reference to FIG. 5E, a patterning process and a through-hole forming process are performed, so as to pattern the circuit layers 112 and transform the circuit layers 112 into the outer patterned circuit layers (i.e., the patterned circuit layers 112b and 112c) and to form the outer conductive through holes 114b. The outer patterned circuit layers 112b and 112c are respectively electrically connected to the electronic components 120a, 120b, and 120c and the inner patterned circuit layers 112g and 112h through the outer conductive through holes 114b. Namely, the electronic components 120a, 120b, and 120c are electrically connected to the patterned circuit layers 112b and 112c by the conductive through holes 114b. Herein, the build-up structure B2 is defined by the outer patterned circuit layer 112b, 112c, the patterned circuit layers 112a, 112d, 112e, 112f, 112g, and 112h, the dielectric layers 113a, 113b, 113c, 113d, 113e and 113f, the inner conductive through holes 114a and the outer conductive through holes 114b.

With reference to FIG. 5F, two solder mask layers 116 are formed on the upper surface 111c and the lower surface 111d of the core layer 111 and located in the disposition area 111a, and the solder mask layers 116 respectively cover the patterned circuit layers 112b and 112c. To effectively protect the circuit pads 115, surface treatment patterns 117 may be formed on the circuit pads 115. So far, the manufacturing process of the circuit board 110b with the embedded electronic components is substantially completed.

Figure 5G:
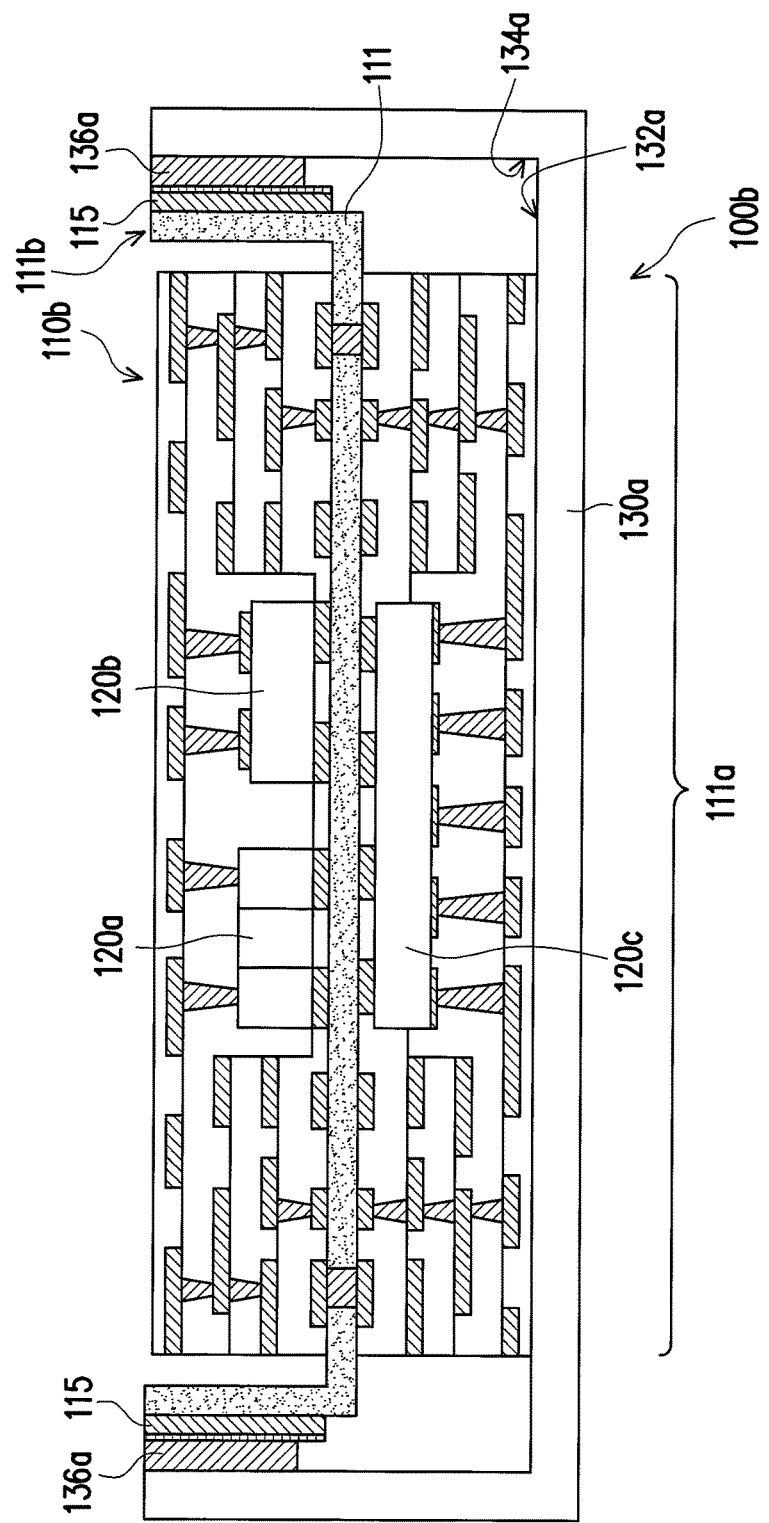

With reference to FIG. 5G, the connecting slot 130a is provided. Here, the connecting slot 130a has the bottom portion 132a, a plurality of sidewall portions 134a connecting the bottom portion 132a, and a plurality of connecting pads 136a located on the sidewall portions 134a. As shown in FIG. 5G, the circuit substrate 110b having the electronic components 120a, 120b, and 120c embedded in the circuit substrate 110b is assembled to the connecting slot 130a. Here, the circuit substrate 110b is located on the bottom portion 132a of the connecting slot 130a, and the circuit pads 115 are electrically connected to the connecting pads 136a through the bent area 111b of the core layer 111 bent relative to the disposition area 111a. So far, the package structure 100b is completely formed.

To sum up, the electronic component of the package structure provided herein is embedded in the circuit substrate, and the circuit substrate is assembled to the bottom portion of the connecting slot. Here, the circuit substrate is located on the bottom portion of the connecting slot, and the circuit pads on the circuit substrate are electrically connected to the connecting pads of the connecting slot through the bent area of the core layer bent relative to the disposition area. Therefore, compared to the conventional package structure which is formed by assembling the component packaged by the molding compound to the female socket, the package structure provided herein has a relatively small package volume Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A package structure comprising:
   a circuit substrate comprising:
      at least one core layer having a disposition area, a bent area surrounding the disposition area, and an upper surface and a lower surface opposite to each other;
      a build-up structure arranged on the core layer and located in the disposition area, the build-up structure comprising at least three patterned circuit layers, at least two dielectric layers and a plurality of conductive through holes, wherein the patterned circuit layers and the dielectric layers are alternately stacked, and the conductive through holes are electrically connected to every two adjacent patterned circuit layers; and
      a plurality of circuit pads arranged on the lower surface of the core layer and located in the bent area;
   at least one electronic component embedded in at least one of the dielectric layers and located in the disposition area, wherein the electronic component is electrically connected to one of the patterned circuit layers through a portion of the conductive through holes; and
   a connecting slot having a bottom portion, a plurality of sidewall portions connecting the bottom portion, and a plurality of connecting pads located on the sidewall portions, wherein the circuit substrate is assembled to the bottom portion, and the circuit pads are electrically connected to the connecting pads through the bent area of the core layer bent relative to the disposition area.

2. The package structure of claim 1, wherein a profile of the disposition area of the core layer is shaped as an oblong, and a profile of the bent area of the core layer is shaped as a plurality of rectangles separated from each other.

3. The package structure of claim 1, wherein the circuit substrate further comprises two solder mask layers respectively arranged on the upper surface and the lower surface of the core layer and located in the disposition area, and the solder mask layers cover two of the patterned circuit layers farthest from the upper surface and the lower surface of the core layer.

4. The package structure of claim 1, wherein the circuit substrate further comprises a plurality of surface treatment patterns respectively arranged on the circuit pads, and the surface treatment patterns are in direct contact with the connecting pads.

5. The package structure of claim 1, wherein the circuit substrate further comprises a plurality of auxiliary patterns arranged on the upper surface of the core layer and located in the bent area, and the auxiliary patterns respectively correspond to the circuit pads.

6. The package structure of claim 1, wherein the number of the at least one core layer is two, and the core layers, the patterned circuit layers, and the dielectric layers are vertically stacked.

7. The package structure of claim 6, wherein an included angle is between each of the sidewall portions of the connecting slot and the bottom portion, the included angle is greater than 90 degrees and less than 180 degrees, and the connecting pads are located at different horizontal levels.

8. A manufacturing method of a package structure, comprising:
providing a circuit substrate having at least one electronic component embedded in the circuit substrate, the circuit substrate comprising: at least one core layer, a build-up structure and a plurality of circuit pads, wherein the core layer has a disposition area, a bent area surrounding the disposition area, and an upper surface and a lower surface opposite to each other, the build-up structure is arranged on the core layer, located in the disposition area and comprising at least three patterned circuit layers, at least two dielectric layers and a plurality of conductive through holes, and the patterned circuit layers and the dielectric layers are alternately stacked, the conductive through holes are electrically connected to every two adjacent patterned circuit layers, the circuit pads are arranged on the lower surface of the core layer and located in the bent area, the electronic component is embedded in at least one of the dielectric layers and located in the disposition area, and the electronic component is electrically connected to one of the patterned circuit layers through a portion of the conductive through holes;
providing a connecting slot, wherein the connecting slot has a bottom portion, a plurality of sidewall portions connecting the bottom portion, and a plurality of connecting pads located on the sidewall portions; and
assembling the circuit substrate having the electronic component embedded in the circuit substrate to the connecting slot, wherein the circuit substrate is located on the bottom portion of the connecting slot, and the circuit pads are electrically connected to the connecting pads through the bent area of the core layer bent relative to the disposition area.

9. The manufacturing method of the package structure of claim 8, wherein the at least three patterned circuit layers comprise a plurality of inner patterned circuit layers and two outer patterned circuit layers, the at least two dielectric layers comprise a plurality of inner dielectric layers and two outer dielectric layers, the conductive through holes comprise a plurality of inner conductive through holes and a plurality of outer conductive through holes, and the step of embedding the electronic component in the circuit substrate comprises:
forming at least one trench in the inner patterned circuit layers and the inner dielectric layers, wherein the trench exposes one of the inner patterned circuit layers, and the inner patterned circuit layers are electrically connected through the inner conductive through holes;
arranging the electronic component in the trench, wherein the electronic component is located on the one of the inner patterned circuit layers exposed by the trench;
respectively laminating each of the outer dielectric layers and a circuit layer on the each of the outer dielectric layers onto the upper surface and the lower surface of the core layer, wherein the trench is filled with at least one of the outer dielectric layers; and
performing a patterning process and a through-hole forming process, so as to pattern the circuit layers and transform the circuit layers into the outer patterned circuit layers and to form the outer conductive through holes, wherein the outer patterned circuit layers are respectively electrically connected to the electronic component and the inner patterned circuit layers through the outer conductive through holes.

10. The manufacturing method of the package structure of claim 9, further comprising:
before assembling the circuit substrate having the electronic component embedded in the circuit substrate to the connecting slot, forming two solder mask layers on the upper surface and the lower surface of the core layer, wherein the solder mask layers are located in the disposition area and respectively cover the outer patterned circuit layers.

11. The manufacturing method of the package structure of claim 8, further comprising:
before assembling the circuit substrate having the electronic component embedded in the circuit substrate to the connecting slot, forming a plurality of surface treatment patterns on the circuit pads.

* * * * *